(12) United States Patent
Liu et al.

(10) Patent No.: US 6,287,966 B1
(45) Date of Patent: Sep. 11, 2001

(54) LOW SHEET RESISTANCE OF TITANIUM SALICIDE PROCESS

(75) Inventors: Chung-Shi Liu; Chen-Hua Yu, both of Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/303,835

(22) Filed: May 3, 1999

(51) Int. Cl.[7] ............... H01L 21/4763; H01L 21/8283; H01L 21/336; H01L 21/44
(52) U.S. Cl. .................. 438/649; 438/199; 438/642; 438/648; 438/651; 438/655; 438/656; 438/664
(58) Field of Search ...................... 438/644, 642, 438/648, 649, 651, 652, 653, 655, 656, 659, 664, 682, 683, 199, 299, 300, 301, 303

(56) References Cited

U.S. PATENT DOCUMENTS

| 5,401,677 | 3/1995 | Bailey et al. ............... 437/200 |
| 5,593,923 | 1/1997 | Horiuchi et al. ............ 437/200 |
| 5,830,775 | * 11/1998 | Maa et al. ................. 437/41 |
| 5,849,634 | * 12/1998 | Iwata et al. ............... 438/655 |

* cited by examiner

Primary Examiner—Chandra Chaudhari
Assistant Examiner—Thanhha Pham
(74) Attorney, Agent, or Firm—George O. Saile; Stephen B. Ackerman

(57) ABSTRACT

A method for establishing low sheet resistance for the Titanium Salicide process that teaches a C-54 $TiSi_x$ process by means of an additional vacuum bake. The present invention teaches an additional vacuum bake step prior to pre-metal HF dip during the Si-ion mixing process, an additional vacuum bake step prior to PAI during the PAI process, an additional vacuum bake step prior to pre-metal HF dip during the PAI process.

9 Claims, 3 Drawing Sheets

FIG. 1 − Prior Art

LOW SHEET RESISTANCE OF TITANIUM SALICIDE PROCESS

BACKGROUND OF THE INVENTION (1) Field of the Invention

The invention relates to the field of the fabrication of semiconductors and more specifically to an improved method of the formation of very narrow conducting lines used for source-drain or poly-gate contacts.

(2) Description of the Prior Art

Semiconductor device improvements have been largely accomplished by reducing device feature size to the point where currently micron and sub-micron device features are being used while predictions for future device sizes do not foresee an end to the trend of ever smaller and denser devices. This continuing trend in the semiconductor industry for smaller and faster devices also requires that these devices be created at constant or lower cost. These devices can essentially be broken down in bipolar devices and memory devices while Metal Oxide Semiconductor Field Effect Transistor (MOSFET) devices form an increasing percentage of the total number of devices that are used in Integrated Circuit (IC) applications. It is projected that by the year 2000 the MOSFET devices will constitute roughly 90% of the overall market whereas the bipolar devices will be used for the remaining 10% of the applications. With reductions in device size is required a reduction in device power consumption which also imposes the requirement of decreased device feature lengths. It can, as a general rule, be stated that device speed varies inversely with device feature length while power consumption increases approximately with the square of the device feature length. Feature size currently being approached is in the micron and sub-micron or 0.5 $\mu$m range where it is not considered impossible that the feature size of 0.2 $\mu$m will become a reality in the near future.

Field Effect Transistors (FET's) are at this time used extensively in Ultra Large-Scale Integration (ULSI) applications. FET's are formed using gate electrodes, usually made of polysilicon, and adjacent source/drain regions to which self-aligned source/drain contact areas are established. In its basic form, a Metal Oxide Transistor (MOS) has a gate electrode to which a voltage is applied. The gate is created on the surface of a silicon substrate; the voltage that is applied to the gate creates an electric field that is perpendicular to the interface between the gate electrode and the substrate. The areas in the substrate immediately adjacent to the gate electrode are doped thereby varying their electric conductivity. The areas become the source/drain regions. By varying the voltage that is applied to the gate electrode, the electric field in the gate to substrate interface can be varied and, with that, the current that flows between the source and the drain regions. The electric field therefore controls the flow of current through the device; the device is therefore referred to as the Field Effect Transistor.

Reduction in device feature size brings with it reduction in film thickness while the alignment depth of diffusion layers is also reduced. Where, for instance, titanium films are deposited, these films are of reduced thickness. For the salicide process that is used to establish electrical contacts with the active regions of a FET, titanium is deposited over these active regions (the source/drain region and the top surface of the gate electrode) and subjected to a two step anneal process.

The deposited $TiSi_2$ shows, based and determined by the temperature of the $TiSi_2$, two different reactions, the phase transition from C-49 phase $TiSi_2$ to C-54 phase $TiSi_{2\ and}$ the aggregation reaction. The double anneal cycle causes the phase transfer, the C-49 phase is formed during the first anneal which is changed into the C-54 phase by the second anneal. This reduces titanium silicide sheet resistance but the temperature at which this phase transition takes place increases with decreasing line width.

The aggregation reaction is highlighted next. With the polysilicon that forms the gate structure of a FET of 300 nm wide, and a thinned titanium film, the temperature for the second anneal must be increased. This causes re-arrangement of the crystal structure of the $TiSi_2$ to the point where an aggregate reaction sets in and the sheet resistance of the $TiSi_2$ cannot be reduced any further. This reaction of $TiSi_2$ is referred to as the aggregation reaction. At this temperature, the crystal structure of the $TiSi_2$ becomes very brittle causing problems of metal integrity and reliability. From this it is clear that the effort to reduce sheet resistance requires higher anneal temperature but these higher temperatures cannot be too high since that triggers the occurrence of the titanium silicide aggregation reaction. With ever finer line width, for example 0.3 $\mu$m, the range of temperatures that can be used for the anneal becomes very narrow and process conditions become very limiting. In extreme cases, it may not be possible to find a useful range of temperatures for the anneal process.

In depositing materials to be used for conducting lines it is important to use materials that have low contact resistance and low sheet resistance. These requirements have in the past led to the widespread use of a two-step Titanium Salicide process for contact and local interconnect lines in CMOS devices. With decreasing line size of the source/drain and poly-gate contacts, the formation temperature of C-54 $TiSi_2$ is increasing and its use is more and more constrained due to the difficulty of Polymorphic Phase Transformation (PPT). PPT causes the high resistivity of C-49 phase $TiSi_2$ to be transformed into the low resistivity of C-54 phase $TiSi_2$.

At a polysilicon line width below about 0.5 $\mu$um, the formation of $TiSi_2$ becomes difficult and results in high poly resistance. The transformation of the high resistance C-49 phase $TiSi_2$ to the low resistance C-54 phase $TiSi_2$ was found to be the limiting factor. After the first Rapid Thermal Processing (RTP), small grained (0.1 to 0.2 $\mu$m.) C-49 $TiSi_2$ was formed on both wide (larger that 10 $\mu$m.) and narrow (smaller that 0.4$\mu$m.) polysilicon lines. After a 725 degrees anneal, the $TiSi_2$ on the small polysilicon lines transformed to large grained (1 to 10 $\mu$m.) C-54 phase. However, on narrow lines only smaller grained (smaller than 1 $\mu$m.) C-54 $TiSi_2$ was observed, and this on only a few lines. At a higher temperature anneal (775 degrees C.), C-54 phase was formed on both wide and narrow lines. At 800 degrees C., $TiSi_2$ starts to agglomerate and the line resistance rapidly degrades.

This effect is referred to as the narrow line effect. Several efforts have been made to reduce these narrow line effects. Pre-amorphization of the polysilicon was used to improve the process margin. Selective Wolfram was used as a strapping over $TiSi_2$ to improve the resistivity. $CoSi_2$ was proposed to replace $TiSi_2$ for very fine lines since $CoSi_2$ transformation occurs at a lower temperature and thus full formation of low-resistance $CoSi_2$ is achieved before the silicide agglomerates.

In the formation of contact points to the source and drain regions of CMOS devices, a two step titanium salicide process has frequently been used to form these contacts. Lower contact resistance and lower sheet resistance made the salicide process attractive for the formation of metal contacts and interconnect line contacts. The need for the silicide process has been further emphasized due to the decrease in contact size that resulted in limitations imposed on device performance by the conventional contact structure. Problems with cleaning the small contact openings arose while it also proved difficult to achieve small contact resistance where small contact openings are being used. The two step salicide process further required a separate masking step to create the contact openings, these openings must be aligned with the source and drain regions further limiting the reduction on the size of these regions. With the limitation on the size of the source/drain regions, the contact resistance could also not be further reduced while larger source/drain regions result in relatively large parasitic capacitance between the source/drain regions and the substrate junction thereby reducing device operating speed. To reduce the alignment impact of making contact with the source/drain regions, multiple smaller holes have been used over each of these regions to establish the desired electrical contacts. This however resulted in incomplete contact across the surface of the source/drain regions resulting in larger contact resistance. Several approaches have been used to eliminate the two step titanium salicide process, among these the most frequently used are the salicide process (for self-aligned silicide), the use of elevated source/drain regions (to establish thinner source/drain regions and thereby improve device performance), the creation of contacts using special materials and the deposition of selected materials in contact openings.

FIG. 1 gives an overview of the self-aligned source, drain and gate salicide formation. This process starts with the surface of a semiconductor substrate 10, FIG. 1. The active region that is to be used for the creation of, for instance, a gate electrode, is isolated by forming insulation regions that bound the active region. Field Oxide (FOX) isolation regions 12 can be used to electrically isolate the discrete devices, such as Field Effect Transistors (FET's) in ULSI circuits on semiconductor chips formed from silicon substrate. One conventional approach in the semiconductor industry for forming field isolation is by the Local Oxidation of Silicon (LOCOS) method. LOCOS uses a patterned silicon nitride ($Si_3N_4$) as an oxidation barrier mask, the silicon substrate is selectively oxidized to form the semiplanar isolation. However, this method requires long oxidation times (thermal budget) and lateral oxidation under the barrier mask limits the minimum spacing between adjacent active device areas, and therefore prevents further increase in device packaging density.

One method of circumventing the LOCOS limitations and to further reduce the field oxide (FOX) minimum features size is to allow shallow trench isolation (STI). One method of making STI is to first etch trenches having essentially vertical sidewalls in the silicon substrate. The trenches are then filled with a CVD of silicon oxide ($SiO_2$) and the $SiO_2$ is then plasma etched back or polished back using CMP, to form the FOX isolation region. This region is indicated as region 12 in FIG. 1.

A thin layer of gate oxide is grown over the surface of the substrate 10 on the active device region. To create the gate structure, a layer of polysilicon is grown over the thin layer of gate oxide. The polysilicon layer is masked and the exposed polysilicon and the thin layer of oxide are etched to create the polysilicon gate 14 that is separated from the substrate by the remaining thin layer of oxide 16. The doping of the source/drain regions starts with creating the lightly $N^+$ doped diffusion (LDD) regions 32/34. The sidewall spacers 22 for the gate structure are formed after which the source and drain region doping is completed by doping the source/drain regions 18/20 to the desired level of conductivity using a $N^+$ dopant.

Contact points to the source/drain regions and the electrode gate are then formed by first selectively depositing a layer of titanium over the surface of the source/drain regions and the top surface of the gate electrode. This titanium is annealed causing the deposited titanium to react with the underlying silicon of the source/drain regions and the doped surface of the gate electrode. This anneal forms layers of titanium silicide 24/26 on the surfaces of the source/drain regions and layer 28 on the top surface of the gate electrode.

The metal contacts with the source/drain regions and the gate electrode are formed as a final step. A dielectric 30 such as silicon oxide is blanket deposited over the surface of the created structure, patterned and etched to create contact openings 36/37 over the source/drain regions and the top surface 38 of the gate electrode. The metalization layer selectively deposited over the patterned dielectric establishes the electrical contacts 40/42 with the source/drain regions and 44 with the top surface of the gate electrode.

The above indicated process results in contact openings that are relatively wide since these contact openings must be wide enough for the applied photolithography processes. The process of annealing also uses the underlying silicon during the salicidation process, this process is difficult to control making control of uniform source/drain junction depth difficult to achieve while underlying dopant may also be depleted. The heavy doping required to establish the desired conductivity for the source/drain regions might also result in out diffusion under the gate region thereby reducing the effective channel length for the electrode gate.

Because of these processing issues, the use of salicide for 0.25 $\mu$m and smaller devices requires considerable process development and in some instances new processes have to be used. The present invention addresses a new process that allows for the smaller scaling of salicides.

U.S. Pat. No. 5,593,923(Horiuchi et al.) discloses a process to form C-54-TiSix with a HF dip, Pre-Amorphorizing Implantation (PAI), and an anneal process. However, this reference differs from the invention.

U.S. Pat. No. 5,401,677(Bailey) shows a method for forming Ti Silicide using a HF dip and vacuum bake. See col.5. However, this reference differs from the invention.

SUMMARY OF THE INVENTION

It is the primary objective of the present invention to reduce the sheet resistance of materials used for source/drain contacts and poly-gate contacts formed using the salicide process.

It is another objective of the present invention to reduce sheet resistance of poly-silicon by means of $N^+$, $P^+$ and $N^+$ combined with $P^+$ implant.

It is another objective of the present invention to enable further reduction of semiconductor device line width.

It is another objective of the present invention to enable further reduction in the dimensions of semiconductor device source drain and poly-gate contacts.

The present invention teaches a C-54 TiSix process with the addition of a vacuum bake. Recently, the effects of pre-amorphorizing implantation (PAI) of Si and Si-ion mixing through Ti has been studied to reduce the temperature of C-54 $TiSi_2$ transformation by ion implantation technology.

The first embodiment of the present invention teaches an additional vacuum bake step prior to pre-metal HF dip during the Si-ion mixing process.

The second embodiment of the present invention teaches an additional vacuum bake step prior to PAI during the PAI process.

The third embodiment of the present invention teaches an additional vacuum bake step prior to pre-metal HF dip during the PAI process.

Amorphous materials are devoid of long-range periodic structure and are without real or apparent crystalline form and without division in parts such as that affected by stratification and are frequently used in super-low temperature environments. Pre-Amorphorizing Implantation (PAI) than is the implantation of a material into the stratum of a material wherein the latter material will, at a later stage, be transformed into a structure exhibiting no real crystalline form, a transformation that can be accomplished by means of extremely low temperatures.

A recent study has concentrated on the effects of using the PAI process to mix Si and Si-ions into Ti. The purpose of this study was to determine if this process would reduce the C-54 $TiSi_2$ transformation temperature by means of the indicated ion implant technology. The present invention accomplishes the reduction in the C-54 $TiSi_2$ transformation temperature by means of an additional vacuum bake processing step that will be part of the Si-ion mix and the PAI process, as follows:

introduced in the Si-ion injection process is an additional vacuum bake step, this step to be performed prior to the step of pre-metal HF dip.

introduced in the PAI process is an additional vacuum bake step, this step to be performed prior to the step of PAI of Si and Si-ion mixing or prior to the pre-metal HF dip.

BRIEF DESCRIPTION OF THE DRAWINGS

In the accompanying drawings, forming a material part of the invention, there is shown.

DETAILED DESCRIPTION OF THE PREFERRED EMBODIMENT

Figure 1:
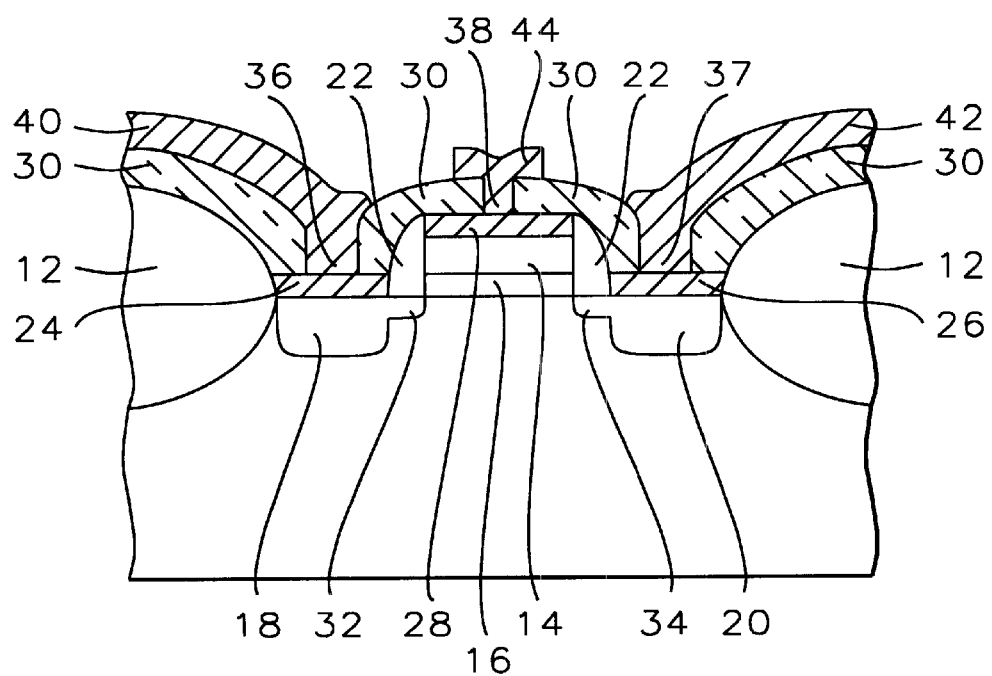
FIG. 1 gives an overview of the Prior Art self-aligned source, drain and gate salicide formation.
Figure 2:
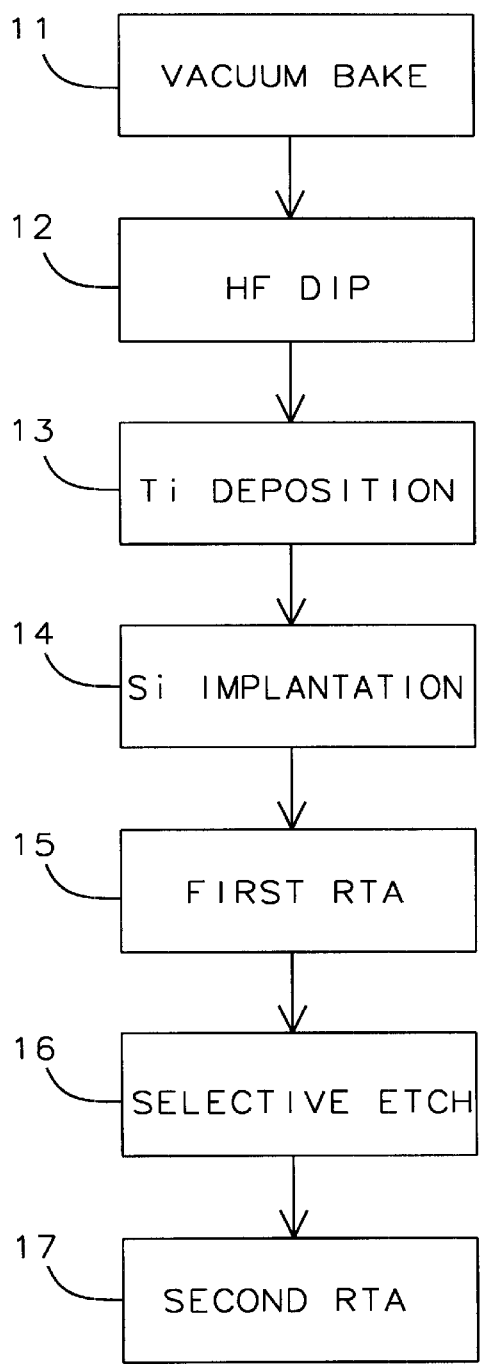
FIG. 2 shows the sequence of steps for the Si-ion implantation process.

FIG. 2 shows the processing steps within the scope of the present invention applied during the Si-ion mixing process, as follows:

Step 11 shows a vacuum bake, this step is new to the Si-ion mixing process, pressure during the vacuum bake is between about 0.5 and 1000 mTorr.

Step 12 shows a HF dip, the HF is a one-time process performed at atmospheric pressure using a conventional wet bench process with a gas source of $H_2O:HF=100:1$ for a duration of about 90 seconds.

Step 13 shows the Ti deposition, the Ti deposition is performed at a temperature of about 100 degrees C. to a thickness of between 250 and 350 Angstrom.

Step 14 shows the Si implantation. This Si implantation can use different conductivity imparting dopants.

A first conductivity imparting dopant, used to create a lightly doped source and drain region, is phosphorous, ion implanted at an energy between about 5 to 100 KeV, at a dose between about 1E11 to 1E14 atoms/$cm^2$.

A second conductivity imparting dopant, used to create a medium doped source and drain region, is arsenic or phosphorous, ion implanted at an energy between about 5 to 50 KeV, at a dose between about 1E12 to 5E14 atoms/$cm^2$.

A third conductivity imparting dopant, used to create a heavily doped source and drain region, is arsenic, ion implanted at an energy between about 5 to 150 KeV, at a dose between about 1E15 to 1E16 atoms/$cm^2$.

Step 15 shows the first Rapid Thermal Annealing, the anneal is typically performed at a temperature between about 700 and 750 degrees C. for a time period of about 30 seconds.

The first RTA is performed to form the C49—$TiSi_2$, the unreacted Ti (that is the Ti on $SiO_2$) will be removed during the following selective etch.

Step 16 shows the selective etch, and

Step 17 shows the second RTA. The second RTA is performed at a temperature between about 850 and 900 degrees C, for a time of about 30 seconds. The purpose of the second anneal is to transform C49—$TiSi_2$ into C54—$TiSi_2$.

Figure 3:
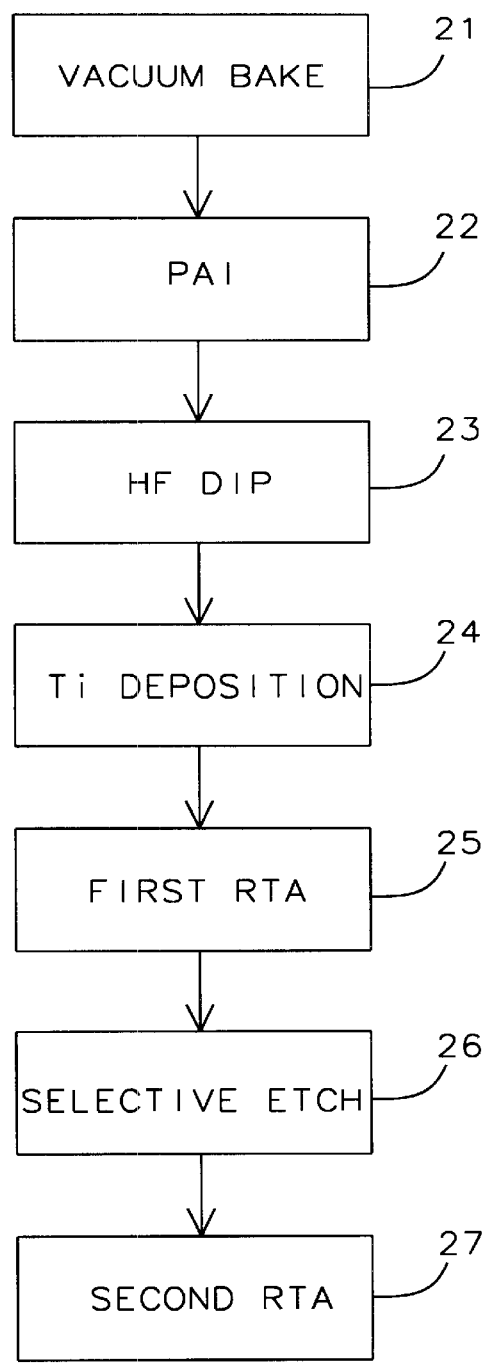
FIG. 3 shows the sequence of steps for the PAI process.

FIG. 3 shows the processing steps within the scope of the present invention applied during the PAI process, as follows:

Step 21 shows a vacuum bake, this step is new to the PAI process,

Step 23 shows a HF dip,

Step 24 shows a Ti deposition,

Step 25 shows the first RTA,

Step 26 shows the selective etch, and

Step 27 shows the second RTA.

The processing conditions for the PAI process are as follows: source: As; temperature: room temperature; pressure $10^{-6}$ Torr; processing tool: Genus; implant energy: about 20 keV; implant dose: about 3E14.

Figure 4:
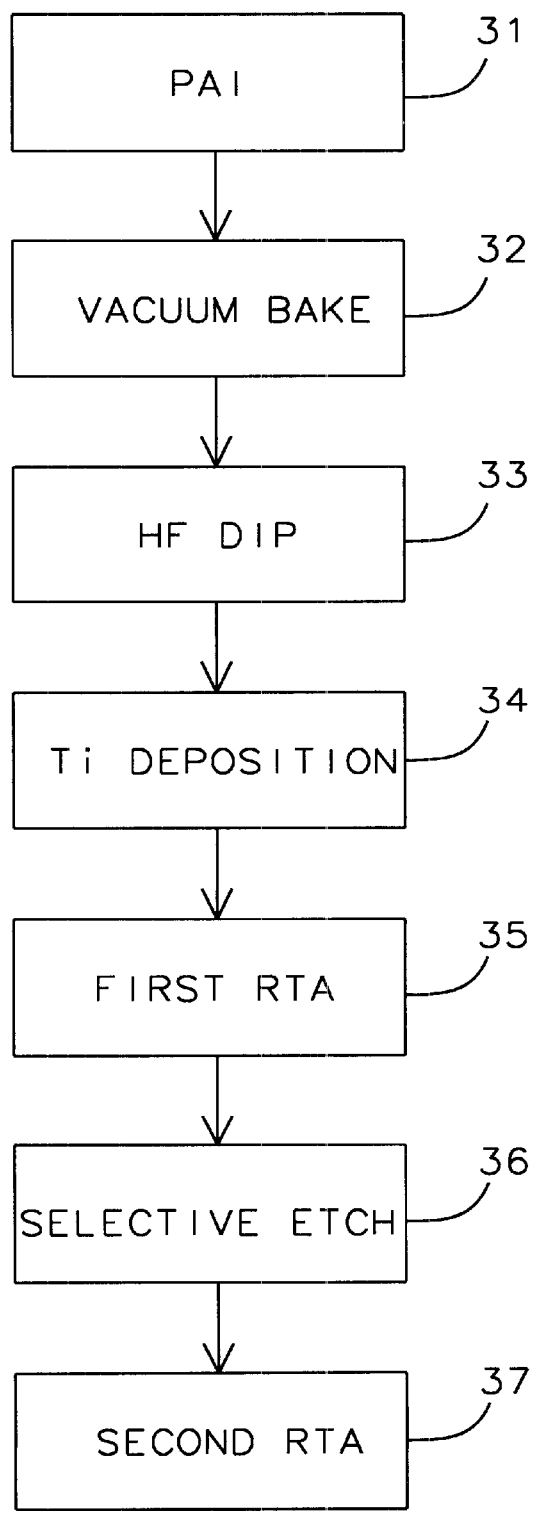
FIG. 4 shows an alternate sequence of steps for the PAI process.

FIG. 4 shows the processing steps within the scope of the present invention applied during an alternate PAI process, as follows:

Step 31 shows a PAI,

Step 32 shows a vacuum bake, this step is new to the PAI process,

Step 33 shows the HF dip,

Step 34 shows the Ti deposition,

Step 35 shows the first RTA

Step 36 shows the selective etch, and

Step 37 shows the second RTA.

It must be noted that the above-indicated Ti deposition can also be the deposition of a Ti/TiN stack for all three processing sequences.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of Titanium salicide formation on the substrate using a silicon injection process comprising the steps of:

providing a silicon substrate;

creating a CMOS device structure on said substrate;

vacuum baking said substrate, said vacuum baking being in-situ or ex-situ vacuum baking said substrate at a temperature in a temperature range of about 300 to 350 degrees C. for a time between about 25 and 35 minutes and a pressure between about 0.5 and 1000 mTorr;

after said vacuum baking, performing a one step HF dip of said substrate;

depositing a layer of titanium over source/drain regions in the surface of said substrate and a polysilicon gate region;

implanting impurity ions in the surface of said substrate;

performing a first Rapid Thermal Annealing process of said substrate;

performing a selective etching of said substrate thereby forming contact areas for the self-aligned source and drain regions in the surface of said substrate; and performing a second Rapid Thermal Annealing process of said substrate thereby forming a layer of said titanium salicide over said source and drain regions in said substrate.

2. The method of claim 1 wherein said HF dip is a one time process performed at atmospheric pressure using a conventional wet bench process with a gas source of $H_2O:HF=100:1$ for a duration of about 90 seconds.

3. The method of claim 1 wherein said depositing of Titanium upon said substrate is depositing 250 to 350 $A^0$ of Titanium at a temperature of 25 to 300 degrees C. on the surface of said substrate.

4. The method of claim 1 wherein said implanting impurity ions is a first conductivity imparting dopant, used to create a lightly doped source and drain region using phosphorous implanted at an energy between about 5 to 100 KeV, at a dose between about 1E11 to 1E14 atoms/cm$^2$.

5. The method of claim 1 wherein said implanting impurity ions is used to create a medium doped source and drain region using arsenic or phosphorous implanted at an energy between about 5 to 50 KeV, at a dose between about 1E12 to 5E14 atoms/cm$^2$.

6. The method of claim 1 wherein said implanting impurity ions is used to create a heavily doped source and drain region using arsenic implanted at an energy between about 5 to 150 KeV, at a dose between about 1E 15 to 1E16 atoms/cm$^2$.

7. The method of claim 1 wherein said first RTA is performed in a nitric or inert gas atmosphere at a temperature between about 700 and 750 degrees C. for a period not longer than about 30 seconds thereby forming $C49-TiSi_2$.

8. The method of claim 1 wherein said selective etching creates contact areas to the source and drain regions within said substrate.

9. The method of claim 1 wherein said second RTA is performed in a nitric or inert gas atmosphere at a temperature between about 850 and 900 degrees C. for a period of time not longer than about 30 seconds thereby transforming $C49-TiSi_2$ into $C54-TiSi_2$.

* * * * *